United States Patent
Droesbeke et al.

(10) Patent No.: US 10,777,339 B2
(45) Date of Patent: Sep. 15, 2020

(54) GROMMET, ELECTRONIC MEMBER AND METHOD OF FORMING SAID GROMMET

(71) Applicant: Aptiv Technologies Limited, St. Michael (BB)

(72) Inventors: Gert Droesbeke, Erkrath (DE); Tim-Arvid Schroedter, Essen (DE); Andre Oeken, Dusseldorf (DE); Jannik Renfordt, Solingen (DE); Stefan Dubbert, Schwelm (DE); Andre Kleinhoeltig, Coesfeld (DE)

(73) Assignee: APTIV TECHNOLOGIES LIMITED (BB)

( * ) Notice: Subject to any disclaimer, the term of this patent is extended or adjusted under 35 U.S.C. 154(b) by 0 days.

(21) Appl. No.: 16/561,883

(22) Filed: Sep. 5, 2019

(65) Prior Publication Data

US 2019/0392966 A1   Dec. 26, 2019

Related U.S. Application Data

(62) Division of application No. 16/258,732, filed on Jan. 28, 2019, now Pat. No. 10,515,746.

(30) Foreign Application Priority Data

Feb. 8, 2018 (EP) .................................... 18155748

(51) Int. Cl.
  *H01B 17/58* (2006.01)
  *H01B 17/60* (2006.01)
  *H01B 19/00* (2006.01)
  *H05K 5/06* (2006.01)
  *H02G 3/06* (2006.01)
  *H02G 15/007* (2006.01)
  *H02G 3/08* (2006.01)

(52) U.S. Cl.
  CPC .......... *H01B 17/586* (2013.01); *H01B 17/60* (2013.01); *H01B 19/00* (2013.01); *H02G 3/0691* (2013.01); *H02G 3/088* (2013.01); *H02G 15/007* (2013.01); *H05K 5/069* (2013.01)

(58) Field of Classification Search
  CPC .................................................... H01B 17/58
  USPC ...................................................... 174/520
  See application file for complete search history.

(56) References Cited

U.S. PATENT DOCUMENTS

| 2,383,018 | A | * | 8/1945 | Shere ................. H01B 17/58 174/151 |
| 7,244,894 | B1 | | 7/2007 | Lipp |
| 2007/0026735 | A1 | | 2/2007 | Pyron et al. |

(Continued)

FOREIGN PATENT DOCUMENTS

| EP | 2690727 A2 | 1/2014 |
| FR | 2813370 A1 | 3/2002 |
| WO | 2010046281 A1 | 4/2010 |

*Primary Examiner* — Stanley Tso
(74) *Attorney, Agent, or Firm* — Billion & Armitage; Michael Collins (57) ABSTRACT

A method of forming a grommet configured to provide support for a cable exiting of a housing is presented herein. The method includes the steps of providing a sleeve and a sealing part and providing one or more reinforcement members in a region of a transition between the sleeve and the sealing part. At least one of the sleeve and the sealing part are made from a material that is softer than a material of said one or more reinforcement members.

5 Claims, 4 Drawing Sheets

(56) References Cited

U.S. PATENT DOCUMENTS

2013/0313787 A1 11/2013 Fujiki
2015/0280413 A1 10/2015 Coyle

* cited by examiner

GROMMET, ELECTRONIC MEMBER AND METHOD OF FORMING SAID GROMMET

CROSS-REFERENCE TO RELATED APPLICATION

This application is a divisional application and claims the benefit under 35 U.S.C. § 120 of co-pending U.S. patent application Ser. No. 16/258,732, filed Jan. 28, 2019 which claims the benefit under 35 U.S.C. § 119(a) of Patent Application No. 18155748.9 filed in the European Patent Office on Feb. 8, 2018, the entire disclosure of each of which is hereby incorporated by reference.

TECHNICAL FIELD OF THE INVENTION

The present invention relates to a grommet for a cable. The grommet comprising a sealing part and a sleeve, wherein one or more separate reinforcement members are provided in a region of a transition between the sealing part and the sleeve. The invention further relates to an electronic member comprising such a grommet and to a method of forming a grommet.

BRIEF DESCRIPTION OF THE SEVERAL VIEWS OF THE DRAWING

The present invention will now be described, by way of example with reference to the accompanying drawings, in which.

In the following description, the same reference numerals will be used for parts having the same or equivalent function. Any statements made having regard to the direction of a component are made relative to the position shown in the drawing and can naturally vary in the actual position of application.

DETAILED DESCRIPTION OF THE INVENTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

A grommet is typically of tubular or ring like shape having a passage formed therein through which an electrical cable passes. The grommet is configured to provide support for electric cables exiting an electronic member at an exit point. The grommet can prevent the electric cable from tearing on the sharp edges of the hole of the exit point, e.g. of a housing of an electronic member.

Moreover, the grommet can act as a seal to protect the electric cables and the electronic components of the member from a chemical attack, such as from moisture entering the housing causing electric contacts to corrode due to oxidation. This is achieved by having a sealing part that is in contact with the inner wall of the exit point extending from the inside to the outside of the electronic member.

In order to attach the grommet to the exit point, the grommets typically have one or more lips that attach to the housing at either side of the exit point. Grommets having a sleeve for cable guidance purposes typically have the outside lip formed as a part of the sleeve.

On subjecting the cable to a comparatively large strain from the outside, by e.g. deflecting the grommet and the cable relative to a housing, the grommet is pivoted about a lip present at the interior of the electronic member causing a part of the sealing surface of the grommet to disengage from the inner wall of the exit point reducing the sealing tightness of the sealing part in such a way that undesirable moisture can enter the electronic component leading to a reduction of the lifetime or even to a malfunction of the electronic component.

It is an object of the invention to improve the seal of a grommet with respect to the inner wall of the exit point. It is a further object of the present invention to increase the support for electric cables exiting an electronic member at the exit point.

A grommet according to an embodiment of this invention comprises a sealing part and a sleeve, wherein one or more separate reinforcement members are provided in a region of a transition between the sealing part and the sleeve.

The sealing part provides a seal between the exit point and the grommet, with the reinforcement member ensuring that the seal is not broken in the region of the transition from the sealing part to the sleeve even if the sleeve of the grommet is deflected relative to the housing.

The reinforcement member makes available a mechanical separation of the flexible sleeve and the sealing part that permits both parts to act in the designed manner over their complete length. Such a mechanical separation between the flexible sleeve and the sealing part is not provided in prior art grommets.

Moreover, the provision of the reinforcement means in the region of the transition can be considered as a shift of the point about which the grommet pivots from within the housing to the outside of the housing further ensuring the maintenance of the seal between the sealing part and the exit point over the length of the sealing part in addition to maintaining the flexibility of the sleeve.

Preferably the sealing part comprises an outer surface and the one or more reinforcement members are provided in the outer surface and the transition region. The provision of the reinforcement members in the outer surface enables the reinforcement members to provide the additional support required at the weak spot of prior art grommets.

Advantageously the one or more reinforcement members interact with the outer surface. Such an interaction can either be in the form of clamping where the reinforcement means engage the sealing part from the outside or in the form of an internal ring that holds the sealing part in the direction of the part of a housing at which it is intended to seal.

It is preferred if a material of at least one of the sealing part and the sleeve, preferably of both, is softer than a material of the one or more reinforcement members. The provision of a soft material has advantageous effects with regard to a sealing effect achieved by the sealing part and a flexibility of the grommet at the position where a cable exits the housing. Moreover, forming the reinforcement member from a material that is harder than that of the other components of the grommet ensures the supporting function of the reinforcement member.

Preferably the grommet further comprises a skeleton, with the skeleton comprising one reinforcement member. The skeleton acts as a support frame for the grommet and thereby aids in the added sealing properties of the sealing part.

Advantageously said reinforcement member is configured as a peripherally extending ring, with the peripherally extending ring, in particular extending from the skeleton and through the sealing part. Forming the reinforcement member as a ring that peripherally extends from the skeleton makes available a member that can engage the housing from within, thereby reinforcing the attachment of the grommet to the housing and thus ensuring a seal in this region.

It is preferred if the grommet further comprises an attachment part, wherein the skeleton comprises a body portion arranged between the attachment part and said reinforcement member, with the body portion preferably extending at least generally in the form of a cylinder between the attachment part and said reinforcement member. The grommet can be attached to the housing by means of the attachment part. Moreover, the forming of the skeleton as a cylinder enables a more uniform formation of the grommet and an improved seat thereof within the housing is made available that improves the seal in addition to being able to be manufactured in a more facile manner.

Preferably the skeleton is at least partly over-molded to form at least one of the sealing part and the sleeve. In this way the grommet can, for example, be produced in a cost effective injection molding process. Moreover, the sealing part can be formed directly at the skeleton.

Advantageously the attachment part comprises a peripherally extending ring recess. The connection between the attachment part and the housing can be improved by such a recess provided the housing has a corresponding part with a complementary shape that engages said recess.

It is preferred if the sealing part is formed at an outer surface of the body portion. In this way the part that is configured to seal can be formed such that any spreading force brought about by the skeleton is transmitted to the seal in order to force the sealing part into a sealing engagement with the housing thereby ensuring a good seal at this point.

Preferably two reinforcement members are provided, wherein the two reinforcement members are configured to clamp said sealing part. The provision of reinforcement members that clamp the sealing part into a fixed predetermined position ensures that a position of the sealing part is not altered on use of the grommet to thereby maintain the seal between the grommet and the housing.

Advantageously the two reinforcement members are configured as respective half shells that clamp said sealing part therebetween. Such half shells are simple to manufacture and in their handling and permit the required support function to be carried out in an expedient manner.

It is preferred if the sealing part comprises sealing means, in particular one, two or more sealing lips, preferably three sealing lips arranged one after the other. Such sealing means ensure a good seal between the grommet and the housing at which the grommet can be arranged.

Preferably the grommet further comprises an attachment part, with the sealing part being arranged between the attachment part and the sleeve, with the attachment part being made of the same material as one of the sealing part and the reinforcement member. The provision of an attachment part ensures the attachment of the grommet to e.g. a housing of an electronic component. The provision of an attachment part that is made from the same material as one of the sealing part and the reinforcement member makes the grommet more versatile in its use.

According to a further aspect the present invention relates to an electronic member having one or more electric cables connected to electronic components present within a housing of the electronic member, with one or more of said electric cables being guided to said electronic components within the housing via one or more grommets, the grommet comprising a sealing part and a sleeve, wherein the sealing part is inserted into a part of the housing and is configured to seal with respect to the part of the housing in which it is received and the sleeve is configured to guide a respective one of the one or more cables to and from the housing, wherein one or more separate reinforcement members are provided in a transition region between the sealing part and the sleeve of the grommet. An electronic member comprising such a grommet can be protected better with respect to moisture and cable failures due to the provision of such a grommet.

According to yet a further aspect the present invention relates to a method of forming a grommet, the method comprising the steps of:

a) providing a sleeve and a sealing part; and
b) providing one or more reinforcement members in the transition region between the sleeve and the sealing part, wherein at least one of the sleeve and the sealing part, and preferably both, are made from a material that is softer than a material of said one or more reinforcement members.

Such a grommet is preferably formed in an injection molding process with the reinforcement member being formed in a mold differing from that used to form the sealing part and/or the sleeve.

Further embodiments of the invention are described in the following description of the Figures. The invention will be explained in the following in detail by means of embodiments and with reference to the drawing in which is shown.

Figure 1:
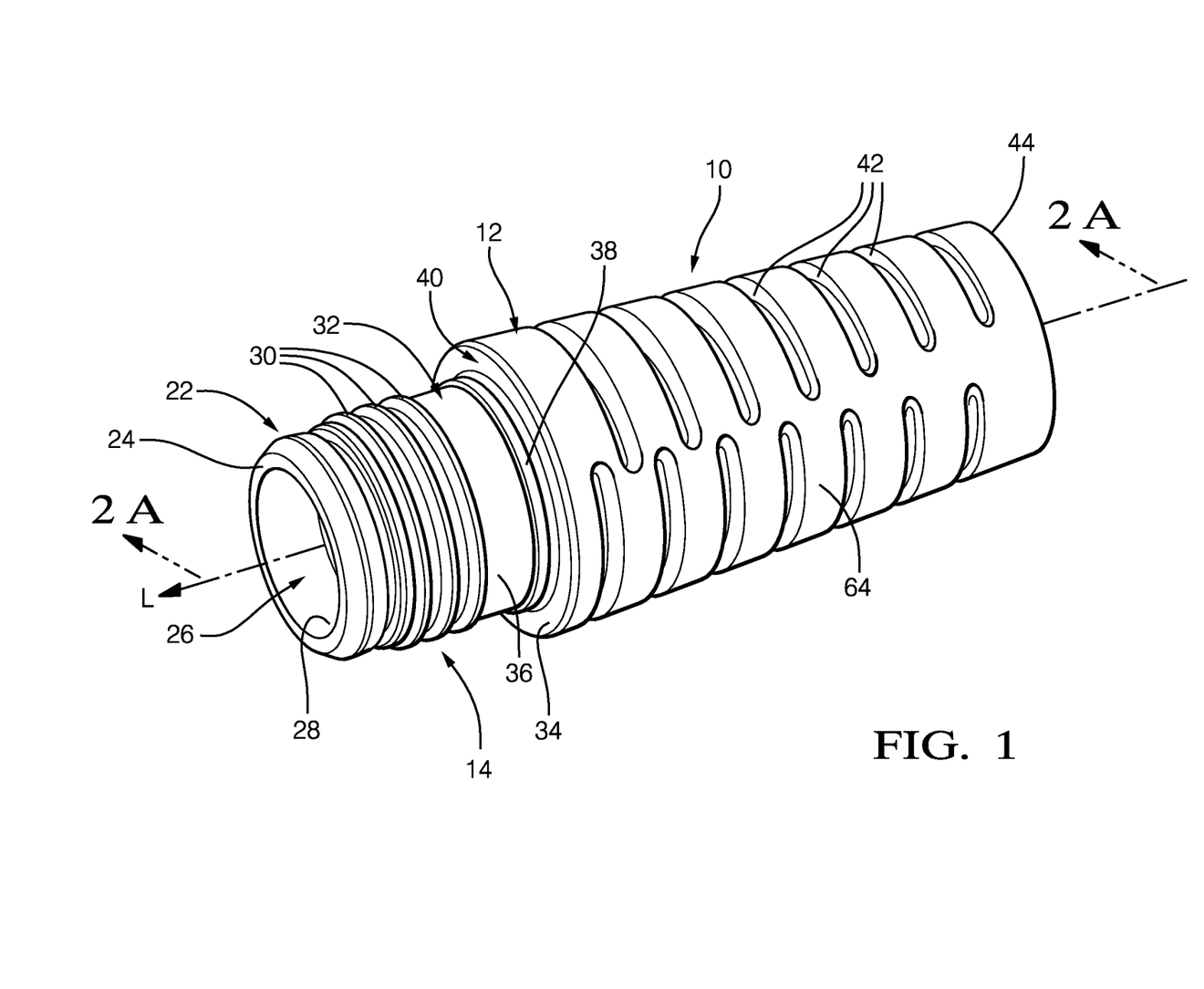
FIG. 1 is a perspective view of a grommet according to a first embodiment of the invention.

FIG. 1 discloses a first embodiment of a grommet 10. The grommet 10 has a generally elongate shape and extends along a longitudinal axis L. The grommet 10 comprises a sleeve 12 and a sealing part 14 arranged around the longitudinal axis L. The sleeve 12 is configured to be arranged outside of a housing 16 (see FIG. 3A), whereas the sealing part 14 is configured to interact with an inner wall 18 of an exit point 20 (see FIG. 3B) of the housing 16.

The sealing part 14 is arranged directly adjacent to an attachment part 22 configured at a housing end 24 of the grommet 10. As indicated e.g. in FIGS. 3A and 3B the grommet 10 can be attached and fixed in position relative to the housing 16 via the attachment part 22.

In order to guide a cable 80 (see FIGS. 3A to 3C) through the grommet 10, the grommet comprises a passage 26 of which an opening 28 is visible at the housing end 24. The sleeve 12 is configured to act as a cable relief on the outside of the housing 16, i.e. preventing the cable from coming into contact with possibly sharp edges of the housing that could cause mechanical faults at the cable.

The sealing part 14 is configured to provide a seal between the inner wall 18 and the grommet 10 in order to prevent fluids from entering the housing 16 between the grommet 10 and the inner wall 18. In the embodiment shown three sealing lips 30 are arranged at an outer surface 32 of the sealing part 14 as sealing means. The sealing lips 30 are arranged between the attachment part 22 and a wall 34 of the sleeve 12.

The outer surface 32 of the sealing part 14 comprises a planar surface region 36 arranged between the wall 34 and the sealing lip 30 that is arranged furthest away from the housing end 24. A separate reinforcement member 38 interacts with the planar surface region 36, by projecting from the planar surface region 36 in the transition region 40 between the sealing part 14 and the wall 34. The separate reinforcement member 38 also acts on the inner wall 18 and thereby forms a support.

The reinforcement member 38 and the transition region 40 between the sealing part 14 and the sleeve 12 are present at an end of the sealing part 14 that is arranged furthest away from the housing end 24 of the grommet 10.

The sleeve 12 comprises cut-outs 42 present therein. The cut-outs make the sleeve 12 more flexible in comparison to a sleeve without cut-outs.

Moreover, the sleeve 12 generally has the shape of a truncated cone. The end of the truncated cone of the sleeve 12 having a larger diameter is present at the wall 34 and the end of the truncated cone of the sleeve 12 having the reduced diameter is present at a cable end 44.

Figure 2A:
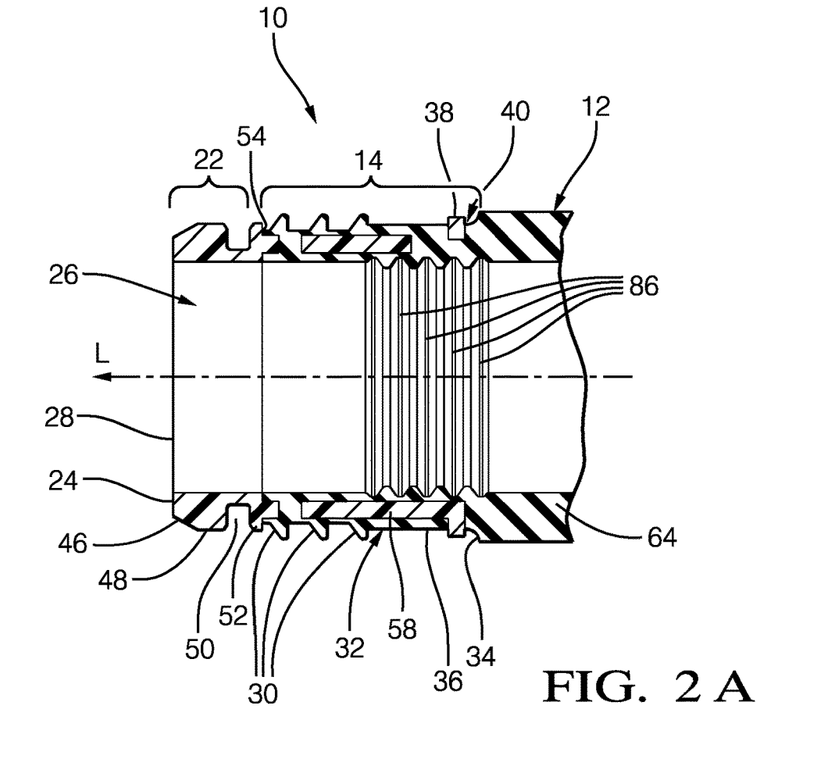
FIG. 2A is cross section view along the sectional line A:A of the grommet of FIG. 1 according to the first embodiment of the invention.

FIG. 2A shows a section through the sealing part 14 of the grommet 10 of FIG. 1 along the sectional line A:A. At the housing end 24 the attachment part 22 comprises a chamfer 46 leading to a first edge 48. A peripherally extending ring recess 50 is formed between the first edge 48 and a second edge 52. The ring recess 50 peripherally extends about the attachment part 22.

The second edge 52 is present at a transition 54 between the attachment part 22 and the sealing part 14. The transition 54 is present between the second edge 52 and the first sealing lip 30. On attachment to the housing 16 (see FIG. 3B), the first and second edges 48, 52 and the ring recess 50 are engaged by an attachment region 56 of the housing 16 having a shape complementary to that of the attachment part 22 in order to hold the attachment part 22 at the attachment region 56.

Figure 2B:
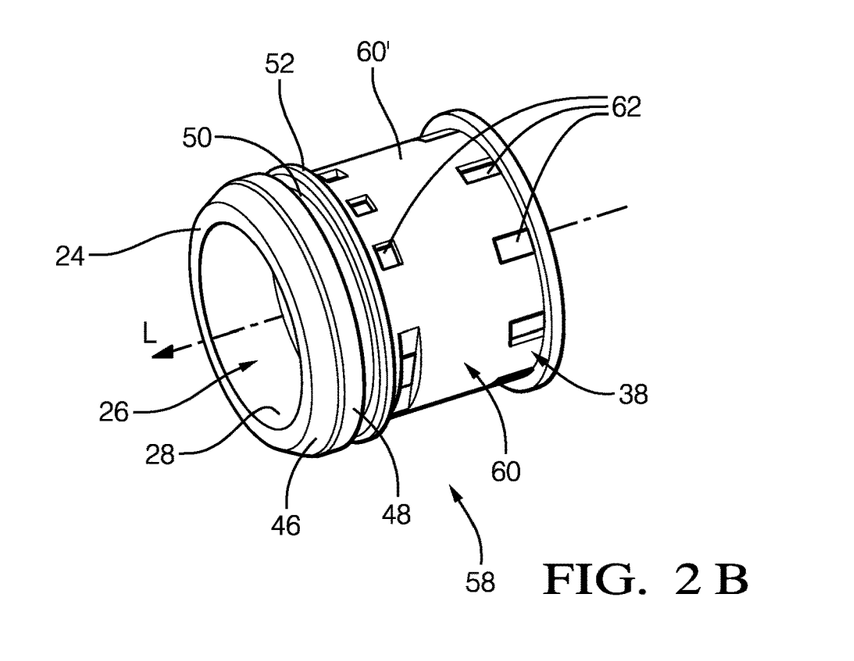
FIG. 2B is a perspective view of a skeleton of the grommet of FIG. 1 according to the first embodiment of the invention.

As shown in FIG. 2B the reinforcement member 38 is part of an integrally formed skeleton 58. The skeleton 58 comprises the attachment part 22 having the chamfer 46, the first edge 48, the ring recess 50 and the second edge 52. The skeleton 58 further comprises the reinforcement member 38 and a body portion 60 connecting the attachment part 22 and the reinforcement member 38. The attachment part 22 is integrally formed with the body portion 60 and the reinforcement member 38. In the example shown the reinforcement member 38 is a ring that projects from the skeleton 58.

The body portion 60 is of cylindrical shape, with a center of the cylindrical shape extending along the longitudinal direction L. The body portion 60 further comprises a plurality of apertures 62 formed therein.

On forming the grommet 10 of FIGS. 1 to 2B, the grommet 10 is made from two parts, the body portion 60 and an over-molded part 64. The over-molded part 64 is formed from a softer material than that of the body portion 60. The over-molded part 64 comprises the sleeve 12 and the sealing part 14, with the planar surface region 36 being formed on an outer surface 60' of the body portion 60.

The skeleton 58 is configured as a support frame of a hard material, such as a plastic material, for example, comprising polyamide, or a metal. The support frame is configured to support the sealing part 14 and the sleeve 12.

Since the over-molded part 64 is formed from a softer material than that of the body portion 60, the sealing part 14 can fulfil its sealing function relative to the inner wall 18 and the sleeve has a certain flexibility in order to allow the cable 80 guided therein to move relative to the housing 16.

The grommet 10 of FIGS. 1 to 2B can, for example, be formed in an injection molding process. In a first step the body portion 60 is formed in a mold (not shown) configured to form the body portion 60.

In a further step prior to completely curing or following a complete curing of the body portion 60, the body portion 60 is over-molded with the softer material in a second mold (not shown) in order to form the sealing part 14 and the sleeve 12 at the body portion 60.

Examples of the softer material used to form the sealing part 14 and the sleeve 12 are rubber or silicone materials, for example TPE-U can be used as a material of the grommet 10.

Due to the plurality of apertures 62 the material of the over-molded part 64 can flow at either side of the body portion 60 and thereby fixedly attach the over-molded part 64 to the body portion 60.

An inner surface of the grommet 10 comprises cable holding means, in the present instance the cable holding means are present in the form of a plurality of ribs 86. It should however be noted that other forms of cable holding means differing from ribs could also be provided. Such cable holding means provide a first point of attachment for the cable 80 in order to hold the cable 80 in the grommet 10 on assembly into the corresponding housing 16 prior to connecting the cable 80 to the housing 16 and/or components present therein. As indicated it is preferred if the cable holding means are arranged at the inner surface in the region of the reinforcement member 38.

Figure 3A:
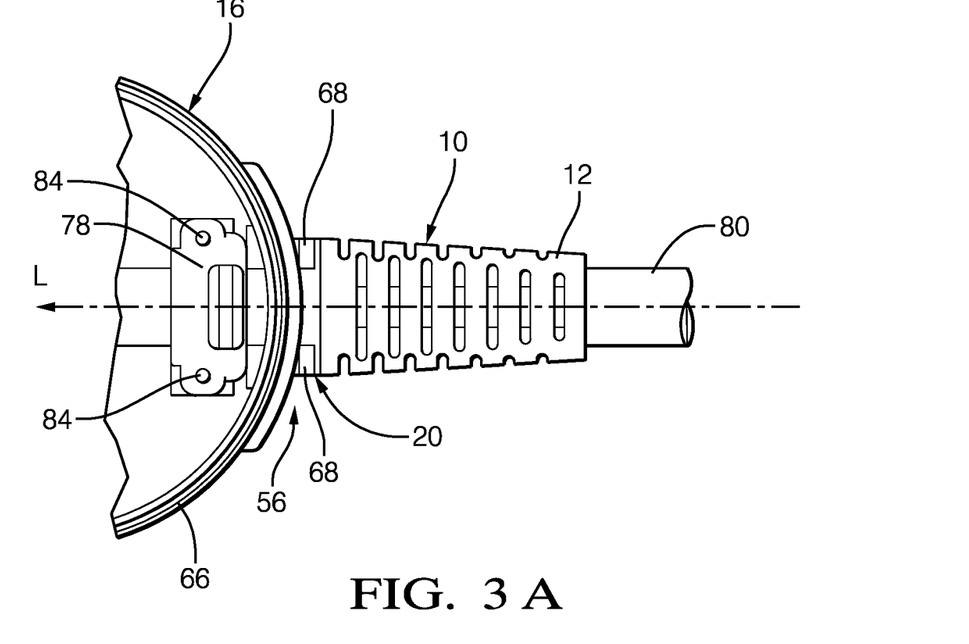
FIGS. 3A to 3D are views of a grommet installed in a housing of an electronic member according to a second embodiment of the invention.

FIG. 3A shows a further embodiment of the grommet 10 installed in a sub-shell 66, i.e. a part, of the housing 16. The housing 16 is a housing of an electronic member, such as that of an AC charger (not shown). The cable 80 is typically connected to electronic components either directly or via a cable guide (neither connection shown).

In contrast to the embodiment depicted in FIG. 2 that shows the reinforcement member 38 that is formed at the body portion 60, two reinforcement members 38 are shown in the embodiment of FIG. 3A that are each formed by a respective half shell 68.

Each half shell 68 is introduced into the grommet 10 in the transition region 40 present between the sealing part 14 and the wall 34 of the sleeve 12. Each half shell 68 interacts with the planar surface region 36 by engaging it via the housing 16.

The half shells 68 are made of a hard material, such as a plastic material, for example, comprising polyamide, or a metal.

Figure 3B:
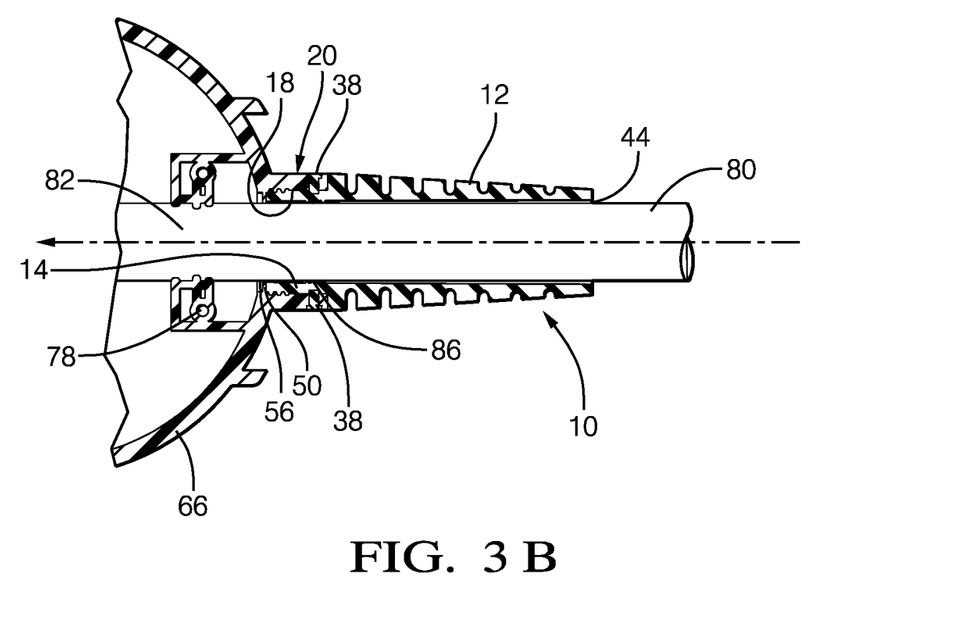

FIG. 3B shows a sectional view through the grommet 10 of FIG. 3A from above on the sectional line B:B that coincides with the longitudinal axis L. At the end 82 of the cable 80, a base 78' of a strain relief 78 is visible. The strain relief 78 is used to clamp the end 82 of the cable 80 at a defined position within the housing 16 so that individual conductors of the cable 80 can be guided within the housing 16.

The strain relief 78 is arranged, in particular directly, adjacent to the exit point 20 that is formed as a passage having the inner wall 18. The inner wall 18 comprises the attachment region 56 and a surface with respect to which the sealing part 14 seals. The grommet 10 is dimensioned such that the attachment part 22, the sealing part 14 and the reinforcement member 38 can engage the exit point to satisfy their respective tasks.

In this connection it should be noted that the strain relief 78 discussed in the foregoing with respect to FIGS. 3A and 3B can likewise be used in the same manner for the grommet 10 as discussed in relation to FIGS. 1 to 2B.

In order to hold the attachment part 22 of the grommet 10 at the housing 16, the attachment region 56 of the housing 16 comprises a projection 56' that engages the ring recess 50 of the attachment part 22. The projection 56' projects from the inner wall 18 of the housing 16 and into the ring recess 50 of the attachment part 22.

The three sealing lips 30 that are configured to engage the inner wall 18 of the housing 16 are arranged between the projection 56' and the reinforcement member 38. Each of the projection 56' and the reinforcement member 38 act as a support for the sealing part 14 of the grommet 10 and due to their positioning at either side of the sealing means prevent the sealing means from disengaging the inner wall 18 and thereby causing a leak if the cable 80 is moved relative to the exit point 20. Such a movement relative to the exit point 20 can cause leaks in prior art grommets that do not comprise a separate reinforcement member.

The end 82 of the cable 80 projecting into the housing can be clamped into position by means of the strain relief 78 (see FIG. 3A). For this purpose the strain relief 78 is connected to the housing 16 by means of fastener elements, such as screws 84. The screws 84 pass through the strain relief 78 and interact with the base 78' of the strain relief.

Figure 3C:
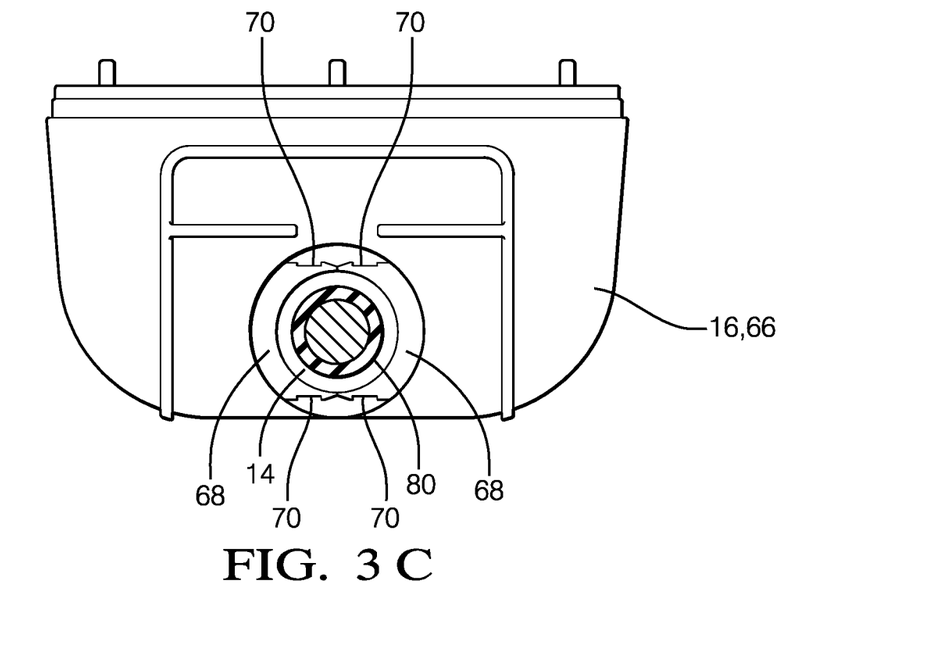

As shown in the section of FIG. 3C taken perpendicular to the longitudinal axis L in the region of the reinforcement members 38 of the grommet 10 shown in FIG. 3A, each of the two half shells 68 is inserted into the housing 16 in the region of the exit point 20 so as to clamp the sealing part 14 and the cable 80 into position. The half shells 68 thereby engage part of the exit point 20 via a snap-fit connection 70. In this connection it should be noted that other types of connections, such as a press-fit connection, could be used rather than the snap-fit connection 70.

Figure 3D:
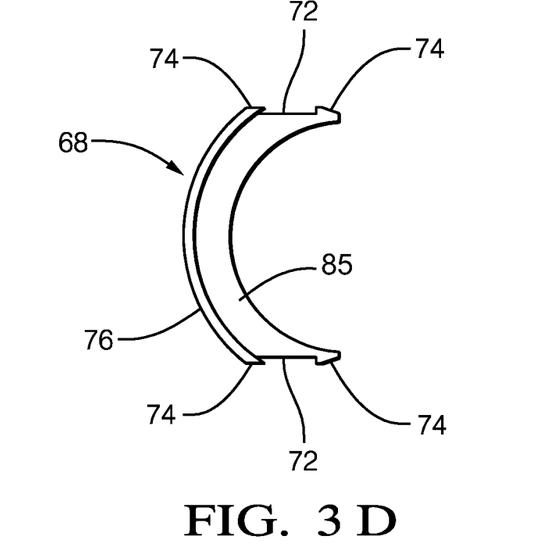

FIG. 3D shows an enlarged view of a respective half shell 68. The half shell 68 comprises two recesses 72 and four lugs 74, with two lugs 74 being arranged at either side of one of the recesses 72. The lugs 74 and the recess 72 form part of the snap-fit connection that interacts with the exit point 20 in order to fix the half shells 68 into position at the grommet 10.

Each of the half shells 68 comprises an inner part 85 that has a smaller width than an outer part 76, with a respective lug 74 associated with each recess 72 being formed at one of the inner part 85 and the outer part 76.

The difference between the two embodiments of the grommets 10 of FIGS. 2 and 3, is that in the first embodiment depicted in FIG. 2 a single reinforcement member 38 is provided in the form of a peripherally extending ring, whereas in the second embodiment of FIG. 3 the reinforcement member 38 is formed by the two separate half shells 68 that are introduced into the housing 16 from the outside to clamp the sealing part 14 at a defined position.

While this invention has been described in terms of the preferred embodiments thereof, it is not intended to be so limited, but rather only to the extent set forth in the claims that follow. For example, the above-described embodiments (and/or aspects thereof) may be used in combination with each other. In addition, many modifications may be made to configure a particular situation or material to the teachings of the invention without departing from its scope. Dimensions, types of materials, orientations of the various components, and the number and positions of the various components described herein are intended to define parameters of certain embodiments, and are by no means limiting and are merely prototypical embodiments.

Many other embodiments and modifications within the spirit and scope of the claims will be apparent to those of skill in the art upon reviewing the above description. The scope of the invention should, therefore, be determined with reference to the following claims, along with the full scope of equivalents to which such claims are entitled.

As used herein, 'one or more' includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

Additionally, while terms of ordinance or orientation may be used herein these elements should not be limited by these terms. All terms of ordinance or orientation, unless stated otherwise, are used for purposes distinguishing one element from another, and do not denote any particular order, order of operations, direction or orientation unless stated otherwise.

We claim:

1. A method of forming a grommet configured to provide support for a cable exiting of a housing, comprising the steps of:

providing a sleeve and a sealing part;

providing one or more reinforcement members in a region of a transition between the sleeve and the sealing part, wherein at least one of the sleeve and the sealing part are made from a first material that is softer than a second material of said one or more reinforcement members;

providing a skeleton, wherein the skeleton comprises one of the one or more reinforcement members that are configured as a peripherally extending ring projecting from the skeleton and through the sealing part, wherein the skeleton comprises a body portion arranged between an attachment part and said one of the one or more reinforcement members, and wherein the body portion defines a plurality of apertures; and at least partly overmolding the skeleton with the first material to form at least one of the sealing part and the sleeve, wherein the over-molded first material of the at least one of the sealing part and the sleeve is disposed within the plurality of apertures and on two sides of the body portion.

2. The method according to claim 1, further comprising the step of:
   fixedly attaching the at least one of the sealing part and the sleeve to the body portion.

3. The method according to claim 2, wherein the sealing part comprises an outer surface and the one or more reinforcement members are provided in the outer surface and a transition region between the sealing part and the sleeve.

4. The method according to claim 3, further comprising the step of:
   arranging a planar surface region between a wall of the sleeve and a sealing lip that is arranged furthest away from a housing end of the grommet.

5. The method according to claim 4, wherein the sealing part is configured to interact with an inner wall of an exit point of the housing and wherein one or more reinforcement members interact with the outer surface by projecting from the planar surface region in the transition region in order to act on the inner wall.

\* \* \* \* \*